US010566390B2

(12) United States Patent
Xiao

(10) Patent No.: US 10,566,390 B2
(45) Date of Patent: Feb. 18, 2020

(54) SERIES CONNECTED QUANTUM DOT LIGHT-EMITTING DEVICE, PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Yadan Xiao, Guangdong (CN)

(73) Assignee: SHENZHEN CHINA STAR OPTOELECTRONICS SEMICONDUTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/001,662

(22) Filed: Jun. 6, 2018

(65) Prior Publication Data
US 2018/0286927 A1    Oct. 4, 2018

Related U.S. Application Data

(63) Continuation of application No. PCT/CN2018/075551, filed on Feb. 7, 2017.

(30) Foreign Application Priority Data

Nov. 20, 2017 (CN) .......................... 2017 1 1157143

(51) Int. Cl.
*H01L 51/50* (2006.01)
*H01L 27/32* (2006.01)
(Continued)

(52) U.S. Cl.
CPC ...... *H01L 27/3204* (2013.01); *H01L 27/3225* (2013.01); *H01L 51/502* (2013.01);
(Continued)

(58) Field of Classification Search
CPC . H01L 51/004; H01L 51/5012; H01L 51/502; H01L 51/5278
(Continued)

(56) References Cited

U.S. PATENT DOCUMENTS

2011/0140075 A1    6/2011  Zhou et al.
2013/0146850 A1*   6/2013  Pieh ..................... H01L 51/5203
                                                        257/40
(Continued)

FOREIGN PATENT DOCUMENTS

CN    106058069 A    10/2016
CN    106601919 A    4/2017
(Continued)

*Primary Examiner* — Long K Tran
(74) *Attorney, Agent, or Firm* — Leong C. Lei

(57) ABSTRACT

An LCD display device and a series connected quantum dot light-emitting device are disclosed. Using N-type charge generation layer and a P-type charge generation layer disposed in a stacked manner, only one pair of electrodes are required to realize a series connection of QLED device and OLED device. The combination of the two types of diode light-emitting devices can overcome their own weakness to form a light-emitting device having narrow full width at half maximum, high color saturation and high luminous efficiency.

17 Claims, 2 Drawing Sheets

(51) Int. Cl.
*H01L 51/52* (2006.01)
*H01L 51/00* (2006.01)

(52) U.S. Cl.
CPC ...... *H01L 51/5012* (2013.01); *H01L 51/5278* (2013.01); *H01L 51/004* (2013.01); *H01L 51/0037* (2013.01)

(58) Field of Classification Search
USPC .......................................................... 257/13
See application file for complete search history.

(56) References Cited

U.S. PATENT DOCUMENTS

| | | | |
|---|---|---|---|
| 2018/0026084 A1* | 1/2018 | Kang | H01L 51/5278 257/40 |
| 2018/0061911 A1* | 3/2018 | Sun | C09K 11/06 |
| 2018/0076394 A1* | 3/2018 | Kawakami | C07D 307/77 |
| 2018/0097052 A1* | 4/2018 | Seok | H01L 27/322 |

FOREIGN PATENT DOCUMENTS

| | | |
|---|---|---|
| CN | 106654037 A | 5/2017 |
| CN | 107046103 A | 8/2017 |
| WO | 2014088667 A2 | 6/2014 |

* cited by examiner

SERIES CONNECTED QUANTUM DOT LIGHT-EMITTING DEVICE, PANEL AND DISPLAY DEVICE

CROSS REFERENCE

This application is a continuing application of PCT Patent Application No. PCT/CN2018/075551, entitled "series connected quantum dot light-emitting device, panel and display device", filed on Feb. 7, 2018, which claims priority to China Patent Application No. CN20171157143.3 filed on Nov. 20, 2017, both of which are hereby incorporated in its entireties by reference.

FIELD OF THE INVENTION

The present invention relates to a display technology field, and more particularly to a series connected quantum dot light-emitting device.

BACKGROUND OF THE INVENTION

Organic light-emitting diode (OLED) has features of self-luminous, fast response, wide viewing angle, high brightness, thin and light such that the market prospects of OLED is optimistic by the industry, and has been recognized as a representative of the third-generation technology. A quantum dot light-emitting device (QLED) has features of high pure color, high luminous efficiency and easily to mix the emitting colors so that the QLED has become a powerful competitor of the OLED. In a flat display field, OLED and QLED has become a hot research of high-end technology.

Specifically, the quantum dot light-emitting material has features of color saturation of emitted light, adjustable wavelength, very narrow full width at half maximum, high electroluminescent efficiency, capable of solution process and capable of applying in flexible device so that the quantum dot light-emitting material has been known as a powerful competitor in the next generation display technology. However, although the development speed of the quantum dot light-emitting material is rapid in the recent year, for the OLED technology capable of mass production, a great gap is still existed in efficiency and life. Accordingly, how to effectively increase the luminous efficiency of QLED device has become an urgent problem required to be solved currently.

SUMMARY OF THE INVENTION

The purpose of the present invention is to provide a QLED device having high color saturation and high luminous efficiency at the same time so as to provide a series connected QLED device structure. Specifically, including following solution:

A series connected quantum dot light-emitting device, comprising: a first electrode, a first light-emitting unit, a charge generation layer, a second light-emitting unit and a second electrode which are sequentially stacked; wherein the first light-emitting unit includes a quantum dot light-emitting layer, the second light-emitting unit includes an organic light-emitting layer, the charge generation layer is used for providing holes and/or electrons for the first light-emitting unit and the second light-emitting unit in order to realize a series connection of the first light-emitting unit and the second light-emitting unit.

Wherein the charge generation layer includes an N-type charge generation layer and a P-type charge generation layer disposed in a stacked manner.

Wherein the N-type charge generation layer is located between the P-type charge generation layer and the first light-emitting unit.

Wherein the N-type charge generation layer and the P-type charge generation layer are formed by different materials.

Wherein the first electrode is used for providing an anode, and the second electrode is used for providing a cathode.

Wherein the first light-emitting unit further includes a hole injection layer, a hole transport layer and an electron transport layer which are sequentially disposed in a stacked manner; the quantum dot light-emitting layer is located between the hole transport layer and the electron transport layer; the hole injection layer is located between the first electrode and the hole transport layer.

Wherein the second light-emitting unit further sequentially includes an electron injection layer, an electron transport layer and a hole transport layer which are sequentially disposed in a stacked manner; the organic light-emitting layer is located between the electron transport layer and the hole transport layer; the electron injection layer is located between the second electrode and the electron transport layer.

Wherein a material of the N-type charge generation layer is one of ZnO, TiO and BPhen:$Cs_2CO_3$; a material of the P-type charge generation layer is one of neutral PEDOT, MoOx, WOx, C60 and HATCN.

The present invention also relates to a display panel, wherein the display panel includes the above series connected quantum dot light-emitting device.

The present invention also relates to a display device, wherein the display device includes the display panel Using N-type charge generation layer and a P-type charge generation layer disposed in a stacked manner, only one pair of electrodes are required to realize a series connection of QLED device and OLED device. The combination of the two types of diode light-emitting devices can overcome their own weakness to form a light-emitting device having narrow full width at half maximum, high color saturation and high luminous efficiency.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
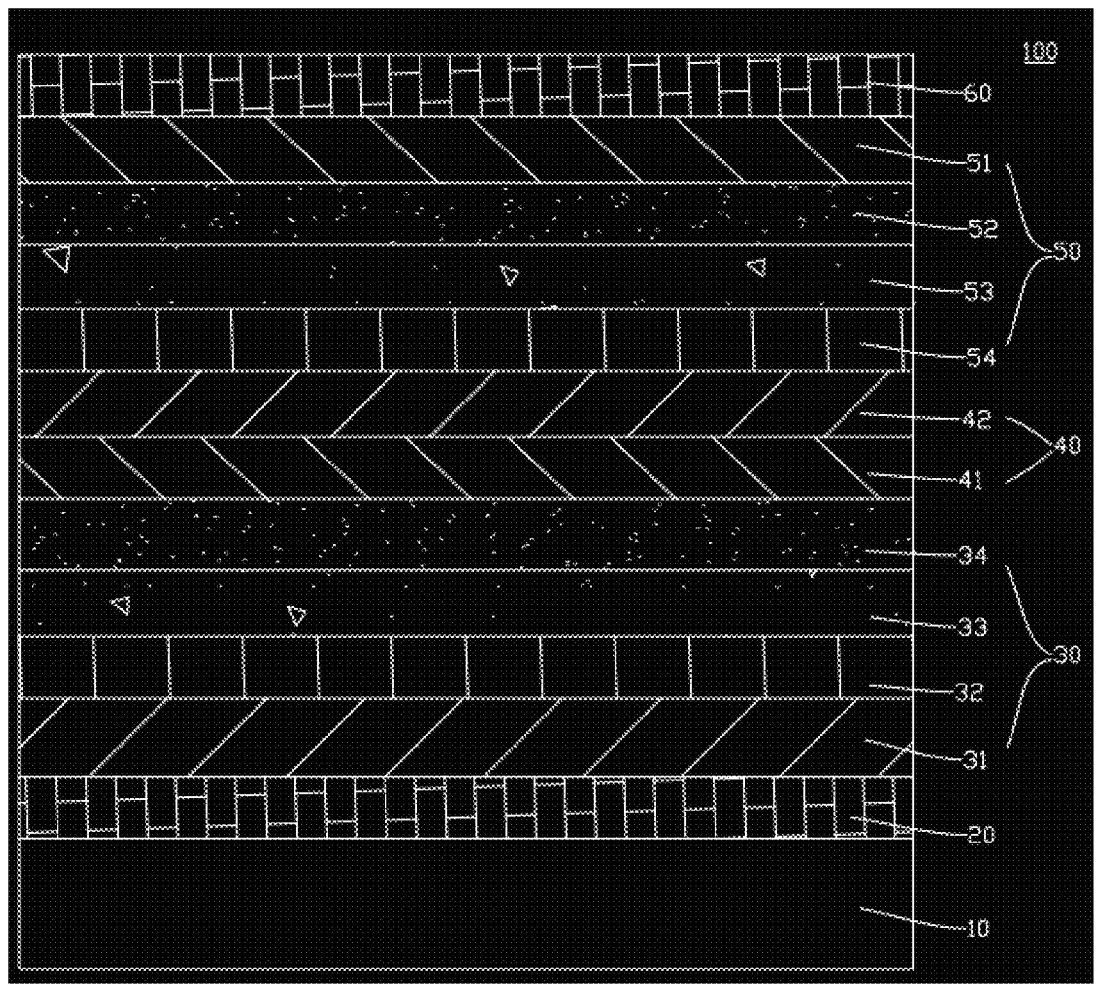
FIG. 1 is a schematic diagram of a series connected quantum dot light-emitting device of the present invention.

With reference to FIG. 1, which shows a series connected quantum dot light emitting device 100. On a TFT substrate 10, a first electrode 20, a first light-emitting unit 30, a charge generation layer 40, a second light-emitting unit 50 and a second electrode 60 are sequentially stacked. That is, the first light-emitting unit 30, the charge generation layer 40 and the second light-emitting unit 50 are disposed between the first electrode 20 and the second electrode 60. Besides, the charge generation layer 40 is disposed between the first light-emitting unit 30 and the second light-emitting unit 50. The first light-emitting unit 30 includes a quantum dot light-emitting layer 33, and the second light-emitting unit 50 includes an organic light-emitting layer 53.

Figure 2:
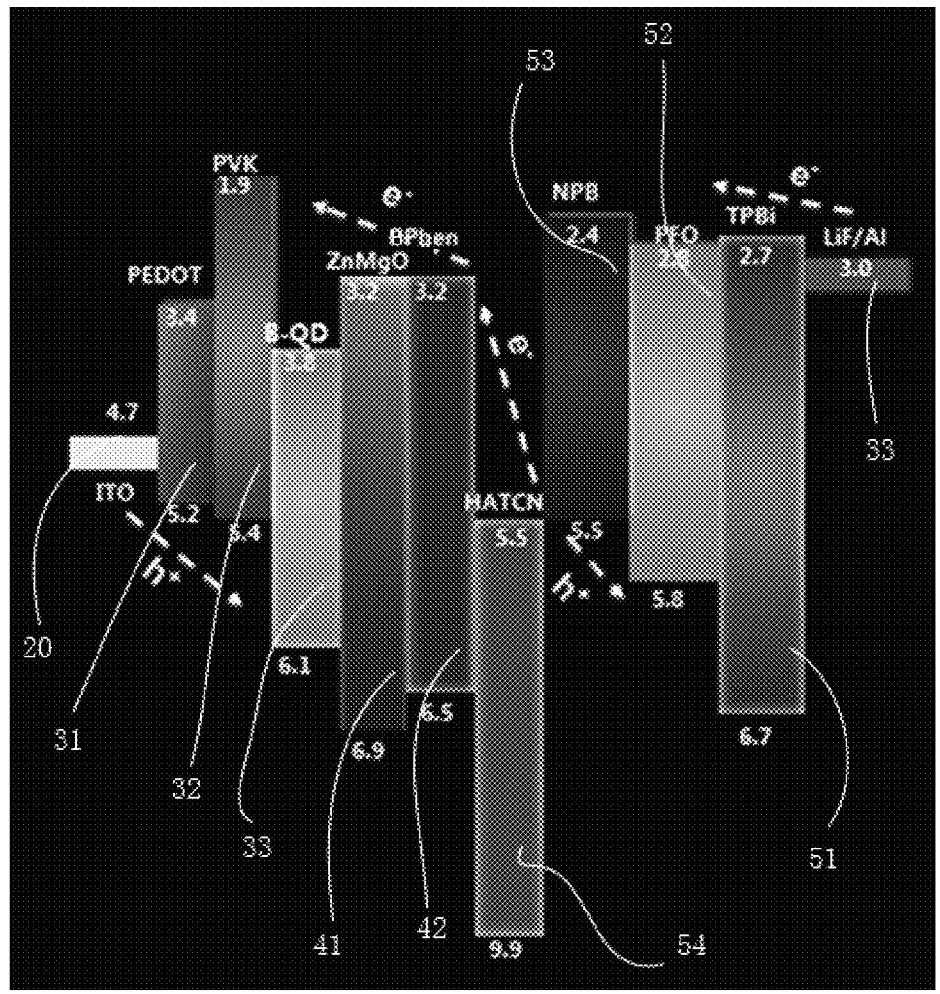
FIG. 2 is a schematic diagram of energy band of the series connected quantum dot light-emitting device of the present invention.

Because of the operation feature of the first light-emitting unit 30 and the second light-emitting unit 50, a difference in energy bands at the first light-emitting unit 30 and the second light-emitting unit 50 should be formed (as shown in FIG. 2). For organic material, an energy band range between an orbit having a highest energy level and occupied with electrons and an orbit having a lowest energy level and without occupying with electrons is known as an energy band. Under a certain voltage for driving, an electron leaves from a cathode and moves from a low energy band to a high energy band through an orbit having a lowest energy level, closed in the difference of the energy levels and without occupying with an electron. A hole is injected from an anode, moves from a high energy band to a low energy band through an orbit having a highest energy level, adjacent material, low energy barrier and occupying with an electron. Through FIG. 2, it can be realized that when the first electrode 20 and the second electrode 60 start to provide the holes and/or electrons, an opposite flow of the holes and/or the electrons is generated because of a relative difference in energy bands. Finally, the holes and/or electrons are combined in the quantum dot light-emitting layer 33 or the organic light-emitting layer 53 in order to realize a light emitting.

In the present invention, because of the charge generation 40, between the first electrode 20 and the second electrode 60, two groups of structures having relative energy band differences are formed. The two groups of structures can respectively provide the first light-emitting unit 30 and the second light-emitting unit 50 to emit lights. That is, the first light-emitting unit 30 can emit lights through the quantum dot light-emitting layer 33, and the second light-emitting unit 50 can emit light through the organic light-emitting layer 53. The series connected quantum dot light-emitting device 100 of the present invention can connect two types of diode light-emitting devices of the first light-emitting unit 30 and the second light-emitting unit 50 in a series connection way under a pair of electrodes.

Both of the first light-emitting unit 30 and the second light-emitting unit 50 are QLED devices. The QLED device has a very narrow full width at half maximum so that the wavelength of the QLED device is easily to be adjusted, and the color saturation is over 100% NTSC color gamut. However, the luminous efficiency is relative low comparing to OLED device. Through the series connection of OLED electroluminescent structure at the QLED device, the full width at half maximum will not obviously increased, and the color saturation will not obviously decreased, but the luminous efficiency of the device can be increased. Comparing two advantages of the two types of electroluminescent devices, the luminous efficiency of the QELD device can be greatly increased.

It can be understood that the first electrode 20 and the second electrode 60 should be a cathode and an anode. In the present embodiment, the first electrode 20 is used for providing the anode, and the material can be TCO transparent conductive oxide such as Indium Tin Oxide (ITO) and Indium Zinc Oxide (IZO). The film can be formed by a magnetron sputtering method, the film thickness is in a range of 20 nm to 200 nm. The second electrode 20 is used for providing the cathode, and the material can select from one of Au, Ag, Al, Mo and Mg or an alloy of Au, Ag, Al, Mo and Mg, the film can be formed through a vacuum evaporation method, and a film thickness is in a range of 50 nm to 1000 nm.

For the first light-emitting unit 30, if an active layer of the first light-emitting unit 30 is directly connected with the metal electrode, uneven film surface will be generated in order to affect a transport of carrier. Thus, the first light-emitting unit 30 is disposed to be close to the first electrode 20 such that the first light-emitting unit 30 is connected with the charge generation layer 40 in order to avoid the second electrode 20 functioning as a cathode metal electrode so as to increase the luminous efficiency of the device.

The charge generation layer 40 provides with an N-type charge generation layer 41 and a P-type charge generation layer and the two layers are stacked. The N-type charge generation layer 41 is an N-type electron transport material or an N-type doped electron transport material. The material of the N-type charge generation layer 41 is one of ZnO, TiO or BPhen:$Cs_2CO_3$, and can be manufactured by a vapor deposition method, and the film thickness is in a range of 1 nm to 100 nm.

The P-type charge generation layer 42 is a P-type hole transport material or a P-type doped hole transport material. The material of the P-type charge generation layer 42 is one of neutral PEDOT, MoOx, WOx, C60 and HATCN, and can be manufactured by a vapor deposition method, and the film thickness is in a range of 1 nm to 100 nm. The N-type charge generation layer 41 and the P-type charge generation layer 42 can be manufactured by a same material. Thus, an interface generated between the N-type charge generation layer 41 and the P-type charge generation layer 42 can be eliminated in order to increase the life of the series connected quantum dot light-emitting device 100. The N-type charge generation layer 41 and the P-type charge generation layer 42 can also be manufactured by different materials, which has an advantage in transport efficiency of transferring or moving electrons or holes.

The N-type charge generation layer 41 is configured to inject electrons to the first light-emitting layer 30. Therefore, the N-type charge generation layer 41 is located at a side of the first electrode 20. Correspondingly, the P-type charge generation layer 42 is configured to inject holes to the second light-emitting layer 40, therefore, the P-type charge generation layer 42 is close to a side of the second electrode 60.

Specifically, at a side close to the first electrode 20, the first light-emitting unit 30 further sequentially includes a hole injection layer 31, a hole transport layer 32 and an electron transport layer 34. The quantum dot light-emitting layer 33 is located between the hole transport layer 32 and the electron transport layer 34. The first electrode 20 and the N-type charge generation layer 41 respectively provides holes and electrons to the quantum dot light-emitting layer 33. The hole injection layer 31 facilitates a hole injection operation for the first electrode 20. The hole transport layer 32 and the electron transport layer 34 respectively finish a transportation operation of holes and electrons.

The material of the hole injection layer 31 can select PEDT:PSS, that is, a aqueous dispersion of poly(3,4-Ethylenedioxythiophene) or poly(sodium-p-styrenesulfonate), and through an inkjet printing method to form a film, and the film thickness is in a range of 1 nm to 100 nm. The material of the hole transport layer 32 can select PVK, that is, polyvinyl carbazole. Through an inkjet printing method to form a film, the film thickness is in a range of 1 nm to 100 nm. The quantum dot light-emitting layer 33 can select a certain proportion of mixed CdZnSe and ZnS in order to form a certain concentration quantum dot solution, and adding a suitable additive to meet a requirement of the inkjet printing, and finally, through an inkjet printing method to form the film. The film thickness is in a range of 1 nm to 100 nm. The electron transport layer 34 can be made of ZnMgO material.

Specifically, at a side close to the second electrode 60, the second light-emitting unit 50 further sequentially includes an electron injection layer 51, an electron transport layer 52 and a hole transport layer 54. The organic light-emitting layer 53 is located between the electron transport layer 52 and the hole transport layer 54. The P-type charge generation layer 42 and the second electrode 60 respectively provide holes and electrons to the organic light-emitting layer 53. The electron injection layer 51 facilitates a hole injection operation for the second electrode 60. The electron transport layer 52 and the hole transport layer 54 respectively finish a transportation operation of electrons and holes.

The material of the electron injection layer 51 can be LiF, and manufactured by a vapor deposition method, and the film thickness is in a range of 0.5 nm to 10 nm. The material of the electron transport layer 52 can be 1,3,5-Tris(1-phenyl-1H-benzimidazol-2-yl)benzene, and manufactured by a vapor deposition method, and the film thickness is in a range of 1 nm to 100 nm. The above organic light-emitting layer 53 can also be a blue light-emitting layer in order to compensate the low luminous efficiency problem of the blue light of the QLED display device. The material can be PFO, and manufactured by a vapor deposition method, the film thickness is in a range of 1 nm to 100 nm. The material of the hole transport layer 54 can be NPB, and manufactured by a vapor deposition method.

The present invention also relates to a display panel including the above series connected quantum dot light-emitting device 100. Because the series connected quantum dot light-emitting device 100 connects the QLED device and OLED device in a series connection way so that the quantum dot light-emitting device 100 has advantages of the both, which has a narrow full width at half maximum, high color saturation and high luminous efficiency. The display device adopts the display panel of the present invention also has high color saturation and high luminous efficiency at the same time.

The above is only the specific implementation mode of the present disclosure and not intended to limit the scope of protection of the present disclosure, and any variations or replacements apparent to those skilled in the art within the technical scope of the present disclosure shall fall within the scope of protection of the present disclosure. Therefore, the scope of protection of the present disclosure should be the scope of protection of the claims.

What is claimed is:

1. A series connected quantum dot light-emitting device, comprising:
   a first electrode, a first light-emitting unit, a charge generation layer, a second light-emitting unit and a second electrode which are sequentially stacked;
   wherein the first light-emitting unit includes a quantum dot light-emitting layer, the second light-emitting unit includes an organic light-emitting layer, the charge generation layer is used for providing holes and/or electrons for the first light-emitting unit and the second light-emitting unit in order to realize a series connection of the first light-emitting unit and the second light-emitting unit;
   wherein the first electrode is made of a transparent conductive oxide material and the second electrode is made of a metallic material and the first light-emitting unit that includes the quantum dot light-emitting layer is arranged distant from the metallic material of the second electrode and is adjacent to the transparent conductive oxide material of the first electrode.

2. The series connected quantum dot light-emitting device according to claim 1, wherein the charge generation layer includes an N-type charge generation layer and a P-type charge generation layer disposed in a stacked manner.

3. The series connected quantum dot light-emitting device according to claim 2, wherein the N-type charge generation layer is located between the P-type charge generation layer and the first light-emitting unit.

4. The series connected quantum dot light-emitting device according to claim 3, wherein the N-type charge generation layer and the P-type charge generation layer are formed by different materials.

5. The series connected quantum dot light-emitting device according to claim 4, wherein the first electrode is used for providing an anode, and the second electrode is used for providing a cathode.

6. The series connected quantum dot light-emitting device according to claim 5, wherein the first light-emitting unit further includes a hole injection layer, a hole transport layer and an electron transport layer which are sequentially disposed in a stacked manner; the quantum dot light-emitting layer is located between the hole transport layer and the electron transport layer; the hole injection layer is located between the first electrode and the hole transport layer.

7. The series connected quantum dot light-emitting device according to claim 5, wherein the second light-emitting unit further sequentially includes an electron injection layer, an electron transport layer and a hole transport layer which are sequentially disposed in a stacked manner; the organic light-emitting layer is located between the electron transport layer and the hole transport layer; the electron injection layer is located between the second electrode and the electron transport layer.

8. The series connected quantum dot light-emitting device according to claim 4, wherein a material of the N-type charge generation layer is one of ZnO, TiO and BPhen:$Cs_2CO_3$; a material of the P-type charge generation layer is one of neutral PEDOT, $MoO_x$, $WO_x$, C60 and HATCN.

9. A display panel, wherein the display panel includes the series connected quantum dot light-emitting device as claimed in claim 1.

10. The display panel according to claim 9, wherein the charge generation layer includes an N-type charge generation layer and a P-type charge generation layer disposed in a stacked manner.

11. The display panel according to claim 10, wherein the N-type charge generation layer is located between the P-type charge generation layer and the first light-emitting unit.

12. The display panel according to claim 11, wherein the N-type charge generation layer and the P-type charge generation layer are formed by different materials.

13. The display panel according to claim 12, wherein the first electrode is used for providing an anode, and the second electrode is used for providing a cathode.

14. The display panel according to claim 13, wherein the first light-emitting unit further includes a hole injection layer, a hole transport layer and an electron transport layer which are sequentially disposed in a stacked manner; the quantum dot light-emitting layer is located between the hole transport layer and the electron transport layer; the hole injection layer is located between the first electrode and the hole transport layer.

15. The display panel according to claim 13, wherein the second light-emitting unit further sequentially includes an electron injection layer, an electron transport layer and a hole transport layer which are sequentially disposed in a stacked manner; the organic light-emitting layer is located between the electron transport layer and the hole transport layer; the electron injection layer is located between the second electrode and the electron transport layer.

16. The display panel according to claim 12, wherein a material of the N-type charge generation layer is one of ZnO, TiO and BPhen:$Cs_2CO_3$; a material of the P-type charge generation layer is one of neutral PEDOT, $MoO_x$, $WO_x$, C60 and HATCN.

17. A display device, wherein the display device includes the display panel as claimed in claim 9.

* * * * *

UNITED STATES PATENT AND TRADEMARK OFFICE
CERTIFICATE OF CORRECTION

PATENT NO. : 10,566,390 B2
APPLICATION NO. : 16/001662
DATED : February 18, 2020
INVENTOR(S) : Yadan Xiao Page 1 of 1

It is certified that error appears in the above-identified patent and that said Letters Patent is hereby corrected as shown below:

On the Title Page

Related U.S. Application Data should read:
Continuation of application No. PCT/CN2018/075551, filed on Feb. 7, 2018.

Signed and Sealed this
Sixteenth Day of June, 2020

Andrei Iancu
*Director of the United States Patent and Trademark Office*